United States Patent
Miao et al.

(10) Patent No.: US 6,362,683 B1
(45) Date of Patent: Mar. 26, 2002

(54) BREAK-BEFORE-MAKE DISTORTION COMPENSATION FOR A DIGITAL AMPLIFIER

(75) Inventors: Guoqing Miao, Roselle Park, NJ (US); Cary L. Delano, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/624,521

(22) Filed: Jul. 24, 2000

Related U.S. Application Data

(60) Provisional application No. 60/146,430, filed on Jul. 29, 1999.

(51) Int. Cl.[7] .................................................. H03F 3/38
(52) U.S. Cl. ...................................... 330/10; 330/207 A
(58) Field of Search ............................... 330/10, 207 A, 330/251

(56) References Cited

U.S. PATENT DOCUMENTS

| | | | |
|---|---|---|---|
| 4,724,396 A | * 2/1988 | Taylor, Jr. et al. ............ | 330/10 |
| 5,126,684 A | 6/1992 | Solomon ....................... | 330/10 |
| 5,973,368 A | * 10/1999 | Pearce et al. ................. | 257/368 |
| 5,986,498 A | * 11/1999 | Rodriguez ..................... | 330/10 |
| 6,064,259 A | 5/2000 | Takita .......................... | 330/10 |

* cited by examiner

*Primary Examiner*—Robert Pascal
*Assistant Examiner*—Henry Choe
(74) *Attorney, Agent, or Firm*—Beyer Weaver & Thomas, LLP

(57) ABSTRACT

Methods and apparatus are described for reducing or eliminating break-before-make distortion in switching amplifiers. A switching amplifier has an input stage for generating a switching signal. Break-before-make distortion compensation circuitry alters the switching signal. Break-before-make generator circuitry generates two drive signals from the altered switching signal. A power stage includes two switches which are alternately driven by the two drive signals. Break-before-make distortion detection circuitry detects a distortion pattern at the power stage output node and controls the break-before-make distortion compensation circuitry to alter the switching signal in response to the distortion pattern detected to thereby eliminate at least some break-before-make distortion.

13 Claims, 13 Drawing Sheets

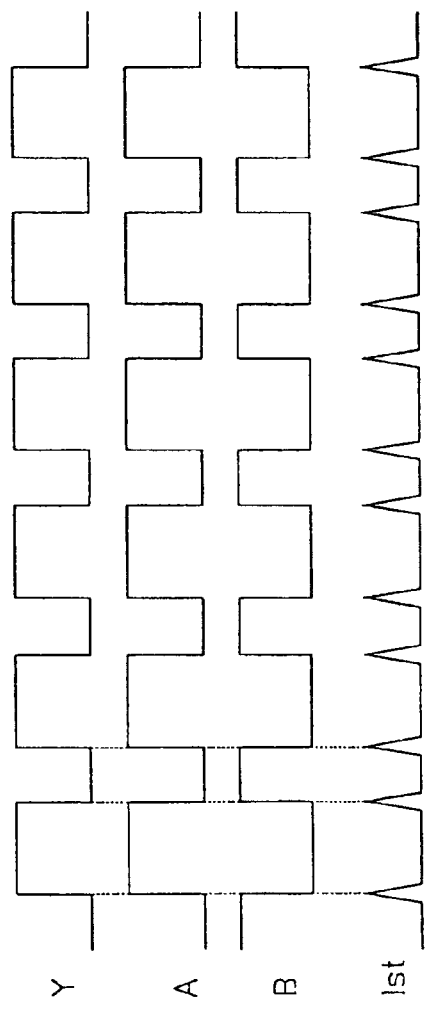
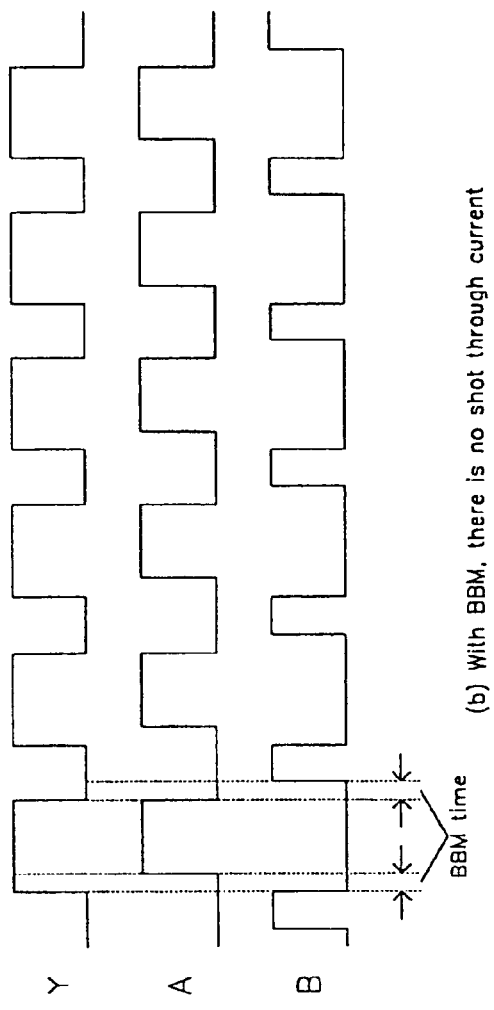

BREAK-BEFORE-MAKE DISTORTION COMPENSATION FOR A DIGITAL AMPLIFIER

RELATED APPLICATION DATA

This application claims the benefit of U.S. Provisional Application No. 60/146,430 filed on Jul. 29, 1999, the disclosure of which is incorporated herein by reference.

The present application claims priority from U.S. Provisional Patent Application No. 60/146,430 for BREAK-BEFORE-MAKE DISTORTION COMPENSATION SYSTEM FOR THE DIGITAL POWER AMPLIFIER filed on Jul. 29, 1999, the entirety of which is incorporated herein by reference for all purposes.

BACKGROUND OF THE INVENTION

The present invention relates to techniques for alleviating distortion in switching amplifiers. More specifically, the present invention provides methods and apparatus for compensating for "break-before-make" distortion in digital switching amplifiers.

Digital power amplifiers are increasing in popularity due to their high power efficiency and signal fidelity. An example of an digital audio amplifier 100 which employs oversampling and noise-shaping techniques is shown in FIG. 1. The input audio signal is oversampled and converted into 1-bit digital data. These data are used by power stage driver 102 to control power switches M1 and M2 which, in this example, comprise two nmos power transistors. To reduce the quantization noise introduced by sampling, amplifier 100 employs a noise-shaping loop filter 104 in a feedback loop which pushes the quantization noise out of the audio signal band. A low pass filter comprising inductor L and capacitor $C_{AP}$ filters out high frequency noise and recovers the amplified audio signal which drives speaker 106.

Referring now to FIGS. 1 and 2a, break-before-make (BBM) generator 108 receives the 1-bit switching signal Y from comparator 110 and generates two signals A and B which are 180 degrees out of phase with each other. A and B are level-shifted by power stage driver 102 to become A' and B' which are used to alternately turn on power transistors M1 and M2. As is well known, if there is no dead time between pulses in A and B, i.e., time when both A and B are low, there is a possibility that both of transistors M1 and M2 may be turned on at the same time creating the potential for an undesirable and possibly catastrophic shoot-through current from the positive power supply VCC to the negative power supply VSS at each transition of Y (as shown in the waveform designated Ist). Such a condition may arise, for example, due to the delays for signals A and B through power stage driver 102, as well as the rise and fall times of transistors M1 and M2. At a minimum, such shoot-through current increases switching losses thereby reducing the amplifier's power efficiency. In the worst case, power transistors M1 and M2 may be damaged or destroyed.

To eliminate shoot-through current and avoid its deleterious effects, and as shown in FIG. 2b, a period of dead time (also referred to herein as break-before-make (BBM) time) is introduced as between signals A and B such that there is a period of time between signal transitions during which both signals are low. This ensures that transistors M1 and M2 are never turned on at the same time even when there are delay mismatches between the rise and fall times of the transistors. Input data BBM<2:0> allows adjustment of BBM time to meet the design requirements of the particular amplifier as shown in Table I. Unfortunately, while the BBM generator eliminates shoot-through current, it produces a degenerative effect on amplifier performance by introducing harmonic distortion. The nature of this distortion is described below with reference to FIGS. 3a, 3b, and 4a–4c.

Referring also to amplifier 100 of FIG. 1, when transistors M1 and M2 are off during the BBM period, the voltage at node C is determined by parasitic capacitance $C_P$. Because inductor L resists instantaneous changes in current, when the output current of the amplifier is charging $C_{AP}$, the voltage at node C is pushed to VCC (clipped by Schottky diode D1) during the BBM period. On the other hand, when the output current is discharging $C_{AP}$, the voltage at node C is pulled down to VSS (clipped by Schottky diode D2).

TABLE I

| BBM<2:0> | BBM time (ns) |
|---|---|
| 000 | 0 |
| 001 | 40 |
| 010 | 80 |
| 011 | 120 |
| 100 | 160 |
| 101 | 200 |
| 110 | 240 |
| 111 | 280 |

FIG. 3a shows the current through inductor L when the input to amplifier 100 is grounded. Under this condition, the signal at node Y is a square wave and the resulting current through L is represented by a sawtooth waveform which changes polarity at each transition of the signal at node Y. By contrast, FIG. 3b shows the switching pattern of the signal at node Y and the current through inductor L when the input to the amplifier is a sine wave. In the first half of the sine wave cycle, the switching pattern at node Y is modulated to have a relatively wide pulse width resulting in transistor M1 being turned on more often than transistor M2. During this time, the inductor current is largely positive, i.e., charging CAP and directed into speaker 106. During the second half of the sine wave cycle, the switching pattern at node Y is modulated to have a relatively narrow pulse width such that transistor M2 is now on more often than transistor M1. This results in a largely negative inductor current, i.e., discharging $C_{AP}$ and flowing out of speaker 106. Near the zero crossing of the sine wave, the switching pattern at node Y is similar to that shown in FIG. 3a which causes the inductor current to switch polarity at each Y node signal transition.

With the description of FIGS. 3a and 3b as background, the nature of the BBM distortion will now be described with reference to FIGS. 4a–4c. FIG. 4a illustrates the case where the switching pattern at node Y is a square wave. This results in waveforms A and B with a predetermined BBM period as shown. The current through inductor L is also shown. Between t1 and t2, i.e., the BBM period, both transistors M1 and M2 are off and the voltage at node C is pulled down to VSS because the inductor current is discharging $C_P$. Between t2 and t3 M2 is turned on, keeping the voltage at node C at VSS while the inductor current change polarity. From t3 to t4, i.e., the next BBM period, M2 is turned off again and the voltage at node C is pushed to VCC because the inductor current is now flowing in the other direction. Beyond t5, this switching pattern is repeated and it can be seen by comparing the signals at nodes Y and C that the BBM time has no effect on the output switching pattern when the input is a square wave.

FIG. 4b illustrates the case where the switching pattern at node Y has relatively wide pulse widths as described above with reference to the first half of the cycle of the sine wave of FIG. 3b. As described above, this corresponds to an inductor current which is charging $C_{AP}$ and directed into speaker 106. At time t1, M2 is turned off and the voltage at node C is kept at VSS by the inductor current during the BBM period until M1 is turned on at t2, at which point the voltage at node C is pulled up to VCC. When M1 is turned off again at t3, the voltage at node C is again pulled down to VSS by the inductor current. After the next BBM period (t3–t4), M2 is turned on and the voltage at node C is kept at VSS. By comparing the signals at node Y and C it can be seen that the output pulse width (at node C) is reduced from the input pulse width (at node Y) by a BBM period.

FIG. 4c illustrates the case where the switching pattern at node Y has relatively narrow pulse widths as described above with reference to the second half of the cycle of the sine wave of FIG. 3b. As described above, this corresponds to an inductor current which is charging parasitic capacitor $C_P$. At time t1, M1 is turned off and the voltage at node C is kept at VCC during the BBM period until M2 is turned on at t2, at which point the voltage at node C is pulled down to VSS. When M2 is turned off again at t3, the voltage at node C is again pulled up to VCC by the inductor current. After the next BBM period (t3–t4), M1 is turned on and the voltage at node C is kept at VCC. By comparing the signals at node Y and C it can be seen that the output pulse width (at node C) is increased relative to the input pulse width (at node Y) by a BBM period.

Thus, for example, for a sine wave input, the output switching pattern at node C introduces relatively little or no distortion at the zero crossings of the input signal. However, the pulse width at node C may be reduced or increased by an entire BBM period during other parts of the sine wave cycle. Because these changes in the output waveform are dependent on the input signal, undesirable distortion results. It is therefore desirable to provide techniques by which this distortion may be reduced or eliminated.

SUMMARY OF THE INVENTION

According to the present invention, a technique is provided by which the distortion due to "break-before-make" (BBM) periods in digital switching amplifiers may be reduced or eliminated by converting the BBM periods into loop delay. A distortion detection circuit detects the BBM distortion and a distortion compensation circuit pre-shapes the input pulse to compensate for the distortion caused by the subsequent BBM circuitry. That is, the distortion compensation circuit "pre-distorts" the input pulse pattern such that the output pulse is delayed from the input pulse by the BBM period but has little or no BBM distortion.

Thus, the invention provides a switching amplifier having an input stage for generating a switching signal. Break-before-make distortion compensation circuitry alters the switching signal. Break-before-make generator circuitry generates two drive signals from the altered switching signal. A power stage includes two switches which are alternately driven by the two drive signals. Break-before-make distortion detection circuitry detects a distortion pattern at the power stage output node and controls the break-before-make distortion compensation circuitry to alter the switching signal in response to the distortion pattern detected to thereby eliminate at least some break-before-make distortion.

The present invention also provides a method for reducing break-before-make distortion in a switching amplifier which includes break-before-make generator circuitry for generating two drive signals from an altered switching signal, and a power stage including two switches which are alternately driven by the two drive signals. A distortion pattern is detected at the output node of the power stage. A switching signal is altered before the break-before-make generator circuitry in response to the distortion pattern detected thereby eliminating at least a portion of the break-before-make distortion.

A further understanding of the nature and advantages of the present invention may be realized by reference to the remaining portions of the specification and the drawings.

BRIEF DESCRIPTION OF THE DRAWINGS

FIGS. 2a and 2b depict waveforms at various nodes in the amplifier of FIG. 1 for the purpose of illustrating elimination of shoot through current using a BBM technique;

DETAILED DESCRIPTION OF SPECIFIC EMBODIMENTS

Figure 1:
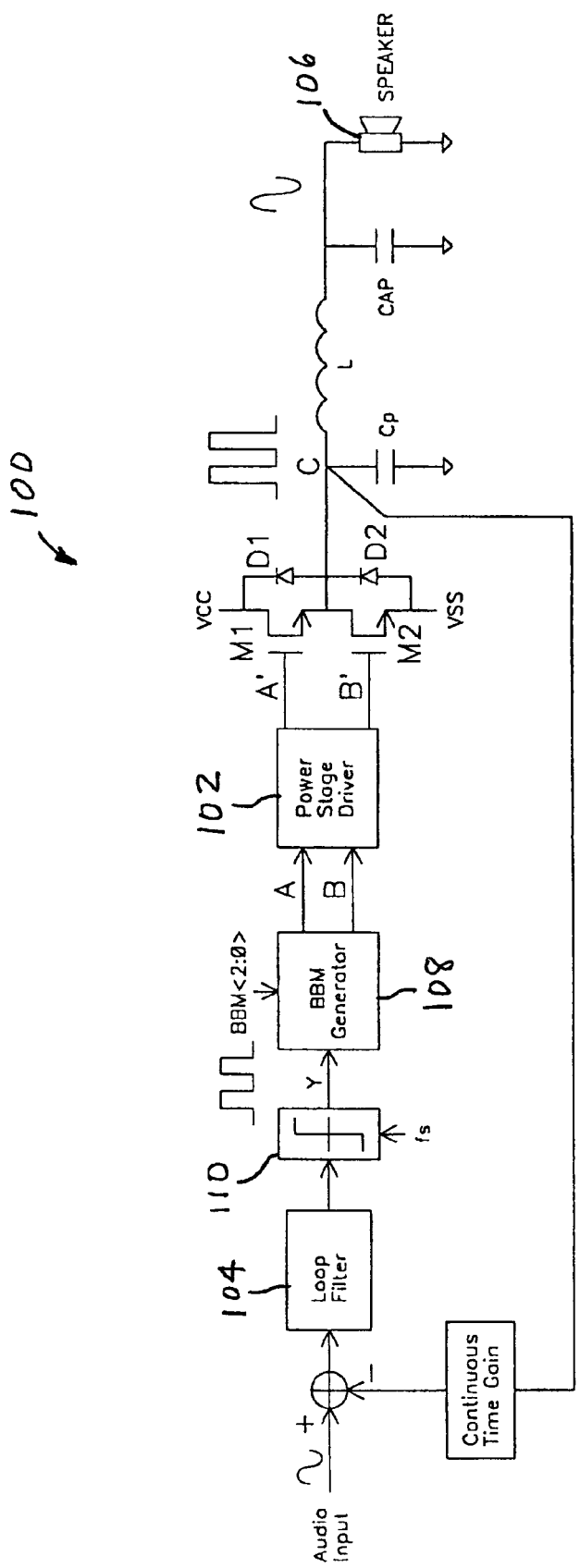
FIG. 1 is a simplified schematic of a digital switching amplifier for illustrating the problem of BBM distortion.
Figure 5:
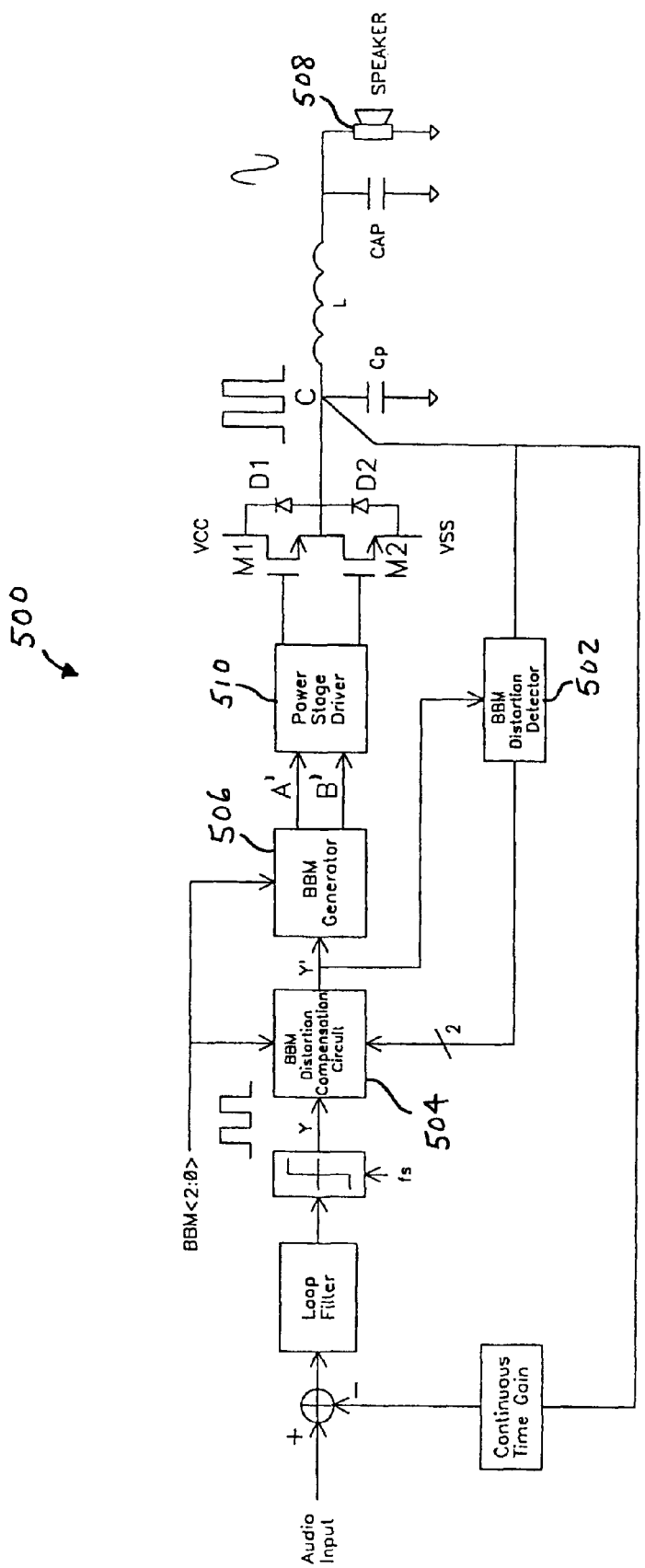
FIG. 5 is a simplified schematic diagram of a digital switching amplifier designed according to a specific embodiment of the BBM distortion compensation technique of the present invention.

According to a specific embodiment of the invention, the manner in which BBM distortion is compensated is determined with reference to the nature of the BBM distortion itself. That is, the distortion pattern is determined so that the appropriate compensation scheme may be applied. FIG. 5 shows a specific implementation of a digital switching amplifier 500 which incorporates such a technique. As compared with amplifier 100 of FIG. 1, amplifier 500 additionally includes BBM distortion pattern detection circuitry 502 and BBM distortion compensation circuitry 504. Detection circuitry 502 determines the nature of the BBM distortion and controls compensation circuitry 504 accordingly to generate a compensated signal at node Y' from the input signal at node Y before being input to BBM generator 506. As will be described below, this results in an output signal at node C which corresponds to the signal at node Y in that the BBM distortion is eliminated.

Figure 3A:
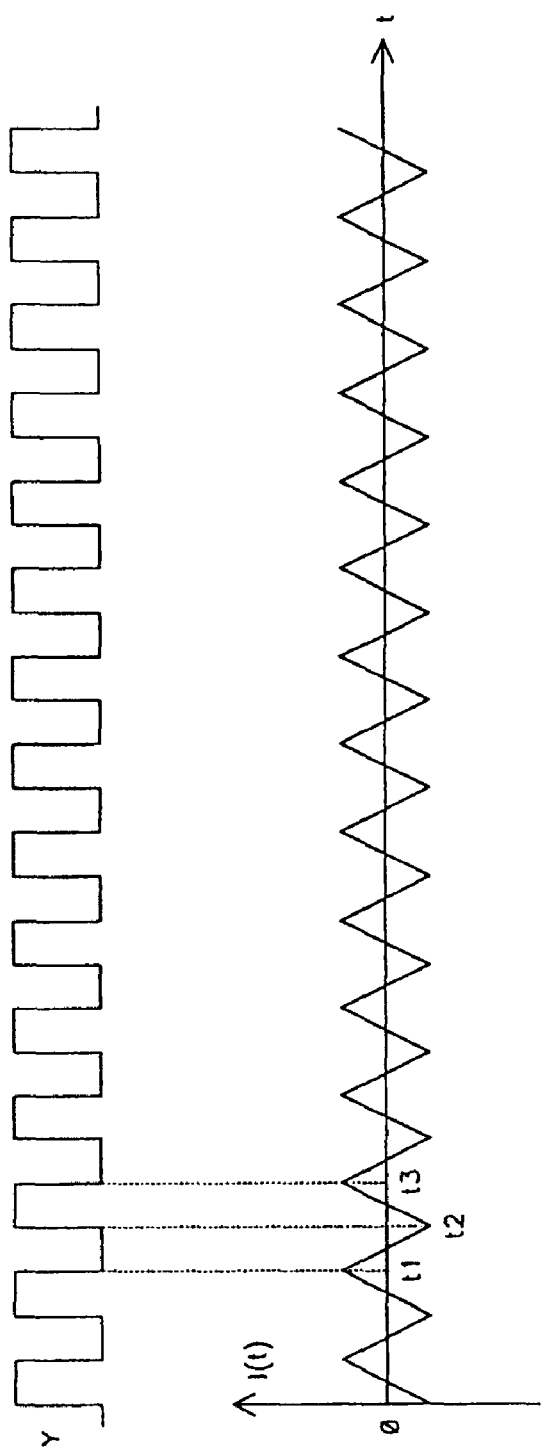
FIGS. 3a and 3b illustrate the relationship between an input pulse and the inductor current for the amplifier of FIG. 1.
Figure 3B:
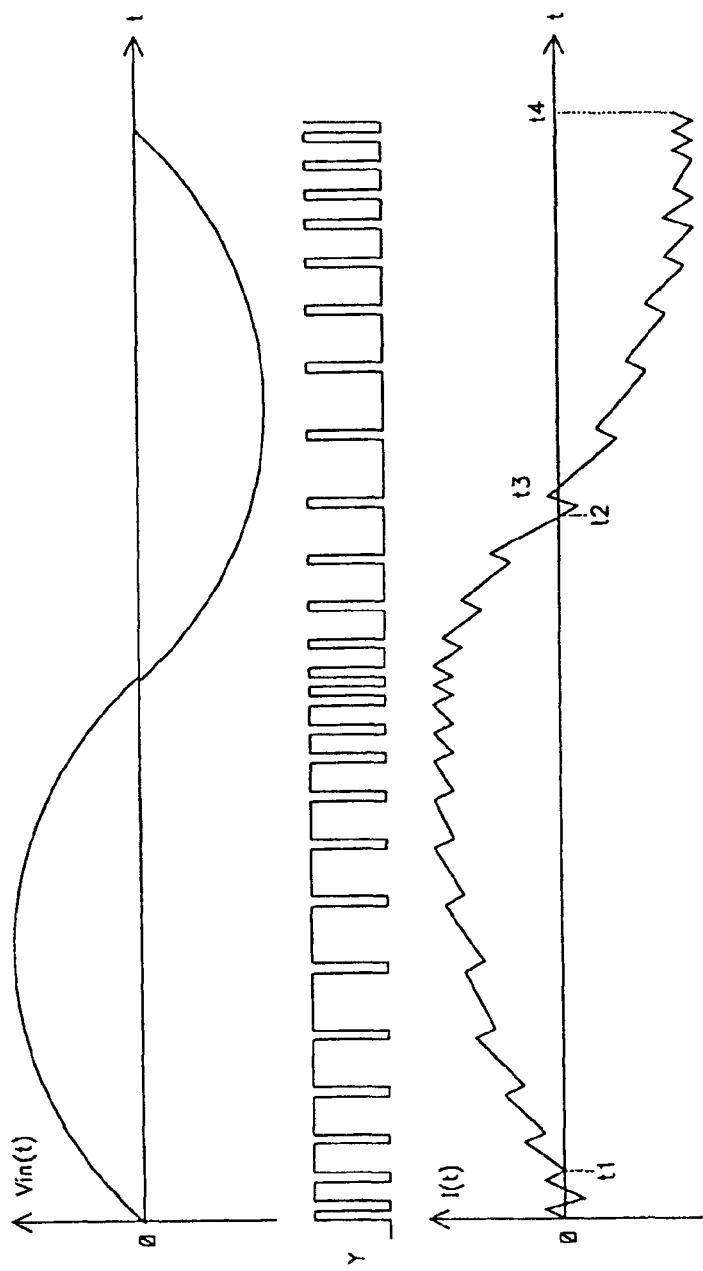
Figure 4A:
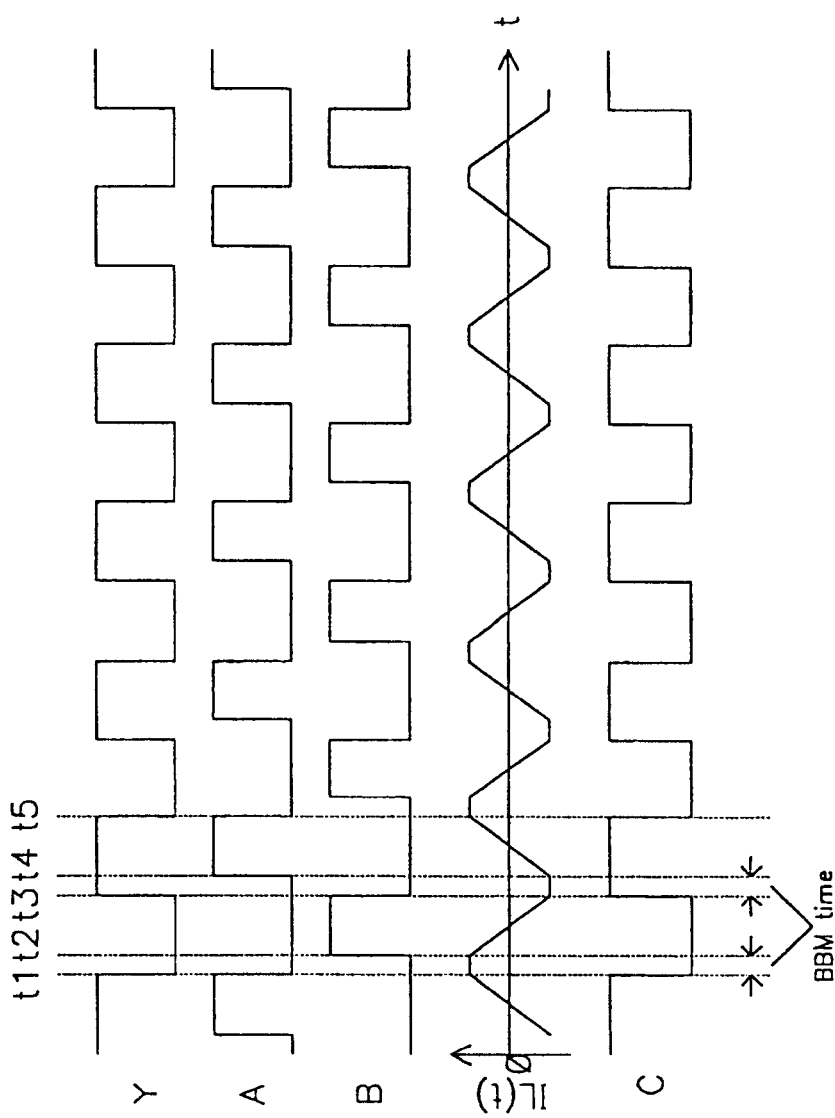
FIG. 4a–4c illustrate three different BBM distortion patterns.
Figure 4B:
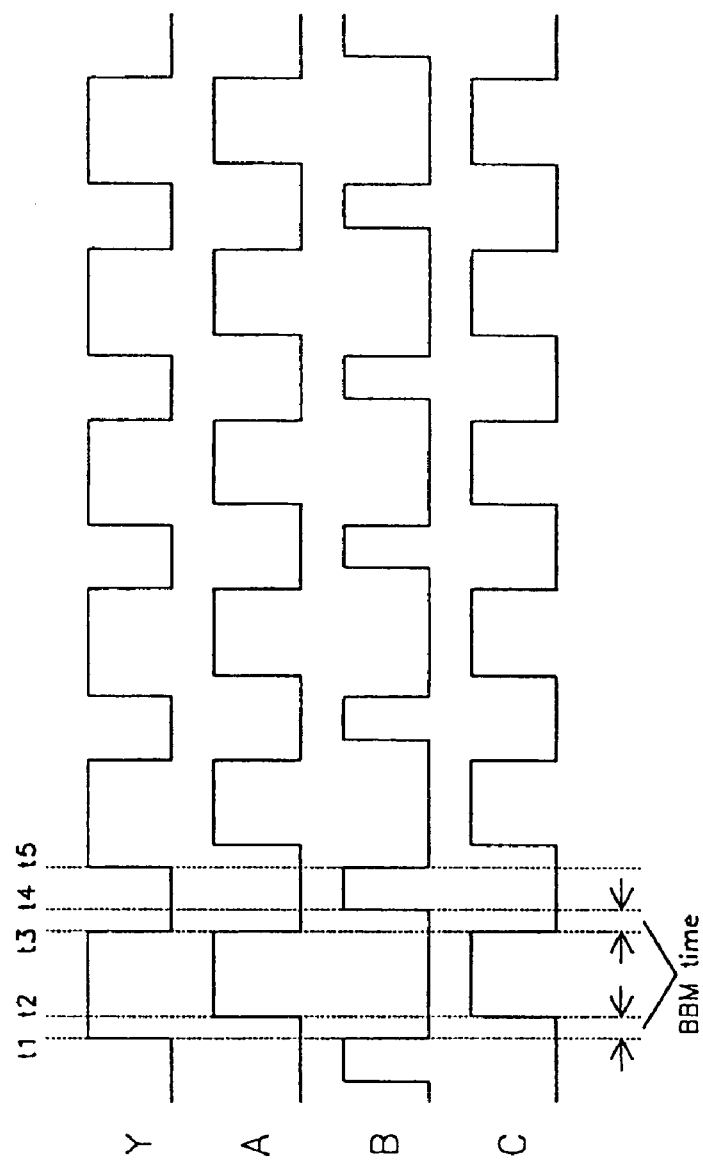
Figure 6A:
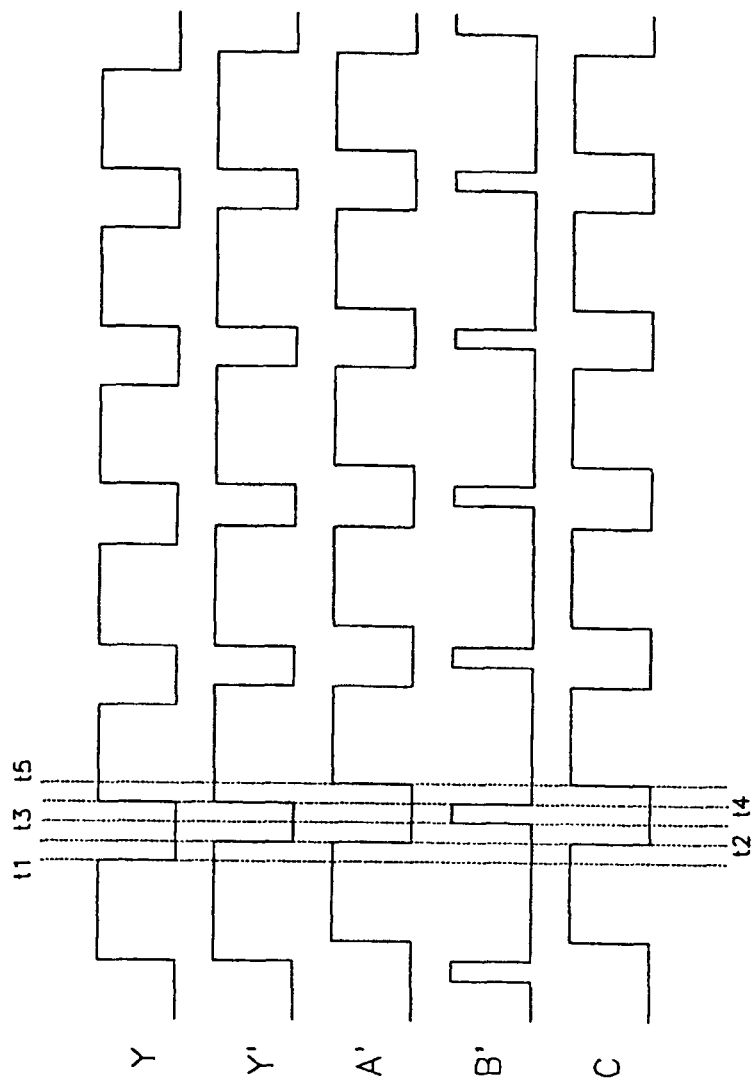
FIGS. 6a–6c illustrate the reduction of BBM distortion for three different BBM distortion patterns according to the present invention.

FIG. 6a illustrates the case where the switching pattern at node Y has relatively wide pulse widths as described above with reference to the first half of the cycle of the sine wave of FIG. 3b. This causes the in ductor current to flow into speaker 508 and charge capacitor $C_{AP}$ which, in an amplifier without the distortion compensation of the present invention (e.g., amplifier 100), would cause the kind of BBM distortion described above with reference to FIG. 4b, i.e., distortion by which the output pulse width at node C is narrowed by the BBM period relative to the pulse width at node Y. To compensate for this, distortion compensation circuitry 504 increases the pulse width of the signal input to BBM generator 506 (i.e., the signal at node Y') by adding the BBM period to the falling edge of the pulses. BBM generator 506 receives the signal at node Y' and generates two signals at nodes A' and B' as shown in FIG. 6*a*. These signals are used by power stage driver 510 to control power transistors M1 and M2.

The result of adding the BBM period to the falling edge of the pulses of the input signal at node Y may be understood with reference to FIG. 6*a*. The BBM periods (i.e., when both transistors are off) are between t2 and t3, and between t4 and t5. At t2 when the signals at both Y' and A' go from high to low, M1 is turned off (M2 already being off) and the inductor current pulls the voltage at node C down to VSS where it remains until M1 is turned on again at t5. As shown in FIG. 6*a*, the output signal at node C resembles the input signal at node Y, i.e., no pulse distortion, with the exception that the signal at node C is delayed by the BBM period. Thus, the "pre-distortion" introduced by compensation circuitry 504 at Y' cancels the distortion introduced by BBM generator 506. In other words, the BBM distortion is effectively converted to loop delay.

Figure 6B:
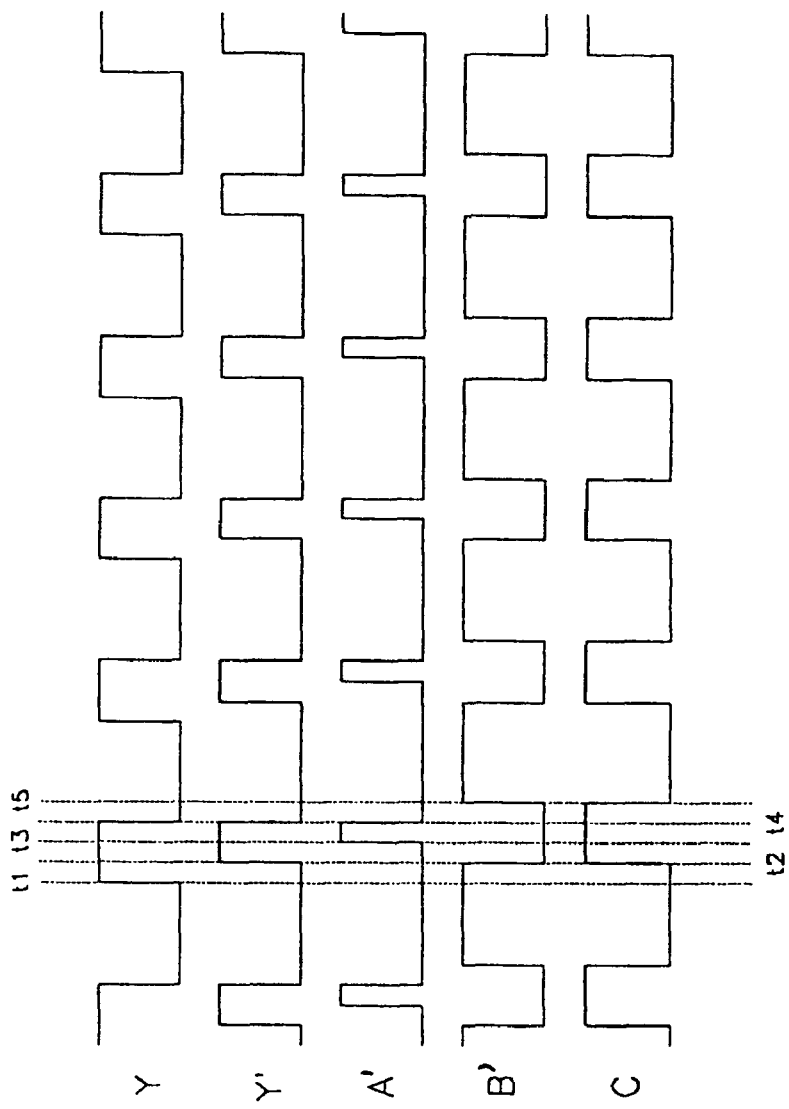

FIG. 6*b* illustrates the case where the switching pattern at node Y has relatively narrow pulse widths as described above with reference to the second half of the cycle of the sine wave of FIG. 3*b*. This causes the inductor current to discharge capacitor $C_{AP}$ which, in an amplifier without the distortion compensation of the present invention (e.g., amplifier 100), would cause the kind of BBM distortion described above with reference to FIG. 4*c*, i.e., distortion by which the output pulse width at node C is widened by the BBM period relative to the pulse width at node Y. To compensate for this, distortion compensation circuitry 504 reduces the pulse width of the signal input to BBM generator 506 (i.e., the signal at node Y') by "removing" a BBM period from the rising edge of the pulses. BBM generator 506 receives the signal at node Y' and generates two signals at nodes A' and B' as shown in FIG. 6*b*. These signals are used by power stage driver 510 to control power transistors M1 and M2.

The result of reducing the pulse width by the BBM period at the rising edge of the pulses of the input signal at node Y may be understood with reference to FIG. 6*b*. The BBM periods are between t2 and t3, and between t4 and t5. At t2 when the signal at node Y' goes from low to high and the signal at node B' go from high to low, M2 is turned off (M1 already being off) and the inductor current pushes the voltage at node C up to VCC where it remains until M2 is turned on again at t5. As shown in FIG. 6*b*, the output signal at node C resembles the input signal at node Y, i.e., no pulse distortion, with the exception that the signal at node C is delayed by the BBM period. Again, the "pre-distortion" introduced by compensation circuitry 504 at Y' cancels the distortion introduced by BBM generator 506.

Figure 6C:
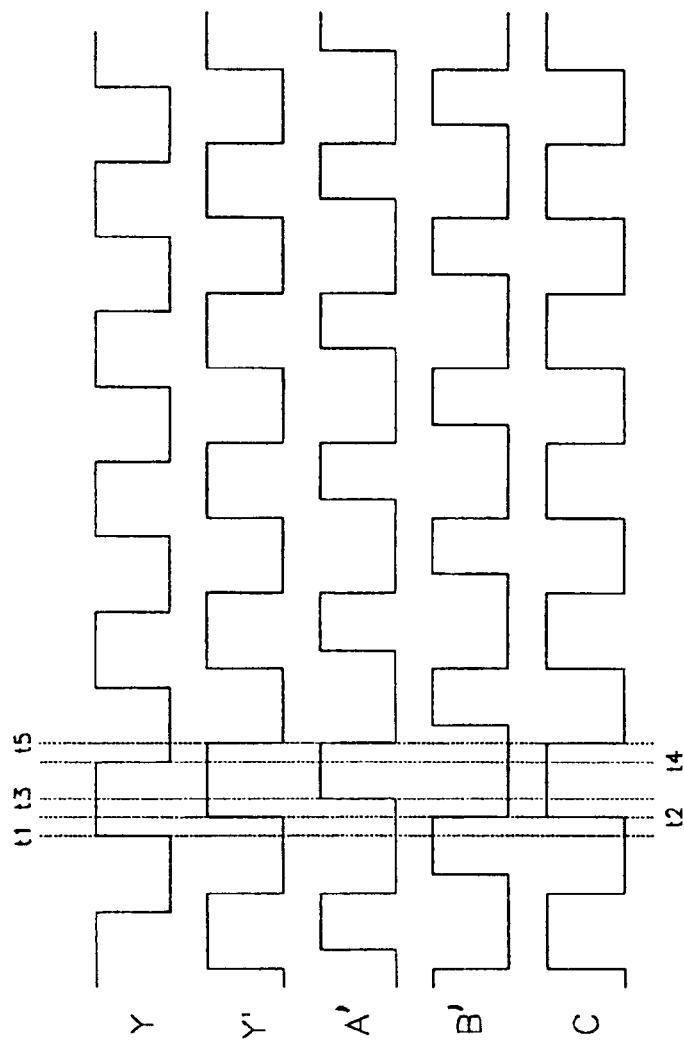

FIG. 6*c* illustrates the case where the switching pattern at node Y is a square wave as described above with reference to the zero crossing region of the sine wave of FIG. 3*b*. This causes the inductor current to change direction at each transition of the signal at node Y which, as described above with reference to FIG. 4*a*, does not result in BBM distortion at node C of amplifier 100. However, to make the output at node C of amplifier 400 consistent with the cases described above with reference to FIGS. 6*a* and 6*b*, distortion compensation circuitry 504 delays the signal at node Y by the BBM period to generate the signal at node Y'. As shown in FIG. 6*c*, the output signal at node C resembles the input signal at node Y, with the exception that the signal at node C is delayed by the BBM period.

Figure 4C:
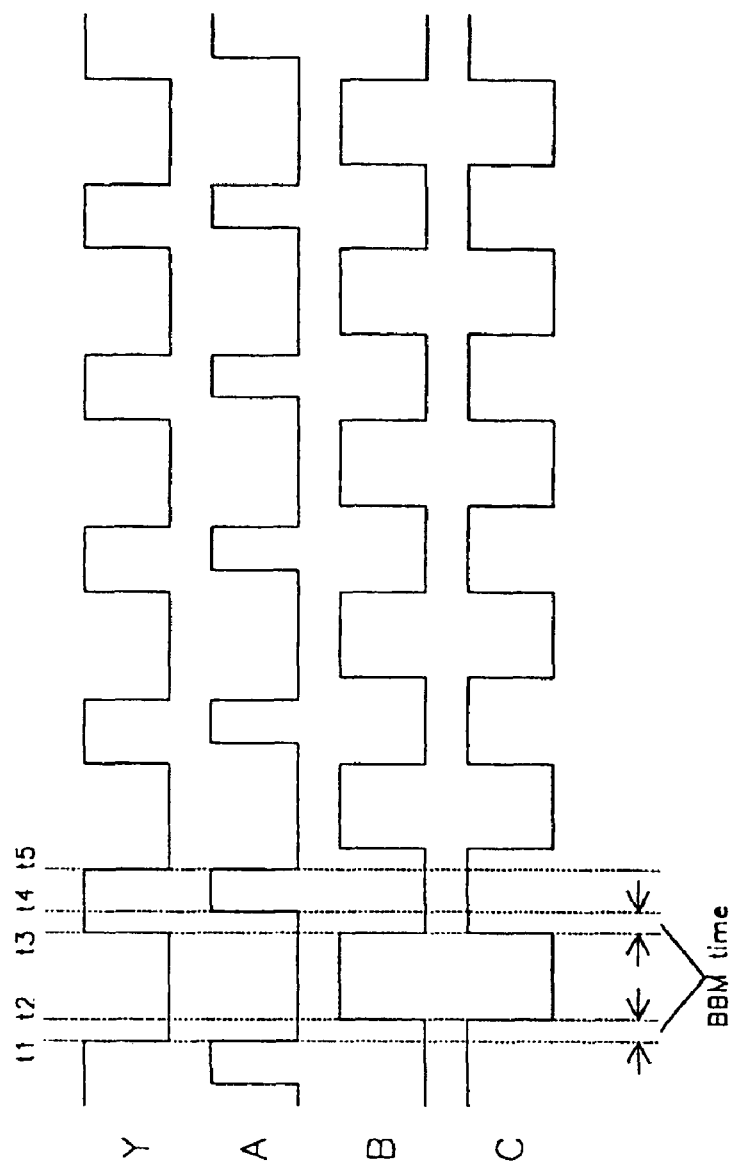

A specific embodiment of the distortion pattern detection circuitry 502 of FIG. 5 will now be described with reference to FIG. 7. As will be understood from the discussion above with reference to FIGS. 6*a*–6*c*, determination of the distortion pattern is necessary for the appropriate BBM compensation measure to be applied. As described above with reference to FIGS. 4*a*–4*c*, there are three relevant distortion patterns which relate to the direction of the inductor current. That is, when the inductor current changes direction for each transition of the signal at node Y, there is no BBM distortion (FIG. 4*a*); when the inductor current is charging $C_{AP}$, the rising edge of the signal at node C is delayed by one BBM period more than the falling edge from the respective corresponding edges of the signal at node Y (FIG. 4*b*); and when the inductor current is discharging $C_{AP}$, the falling edge of the signal at node C is delayed by one BBM period more than the rising edge from the respective corresponding edges of the signal at node Y (FIG. 4*c*).

According to a specific embodiment of the invention, determination of the distortion pattern is accomplished by detecting rising and falling edge delays as between pulses at nodes Y' and C of amplifier 500. By detecting the relative delays between the rising and falling edges of the pulses at nodes Y' and C, the direction of the inductor current and thus the distortion pattern may be determined. This information is then used to control distortion compensation circuitry 504.

Figure 7:
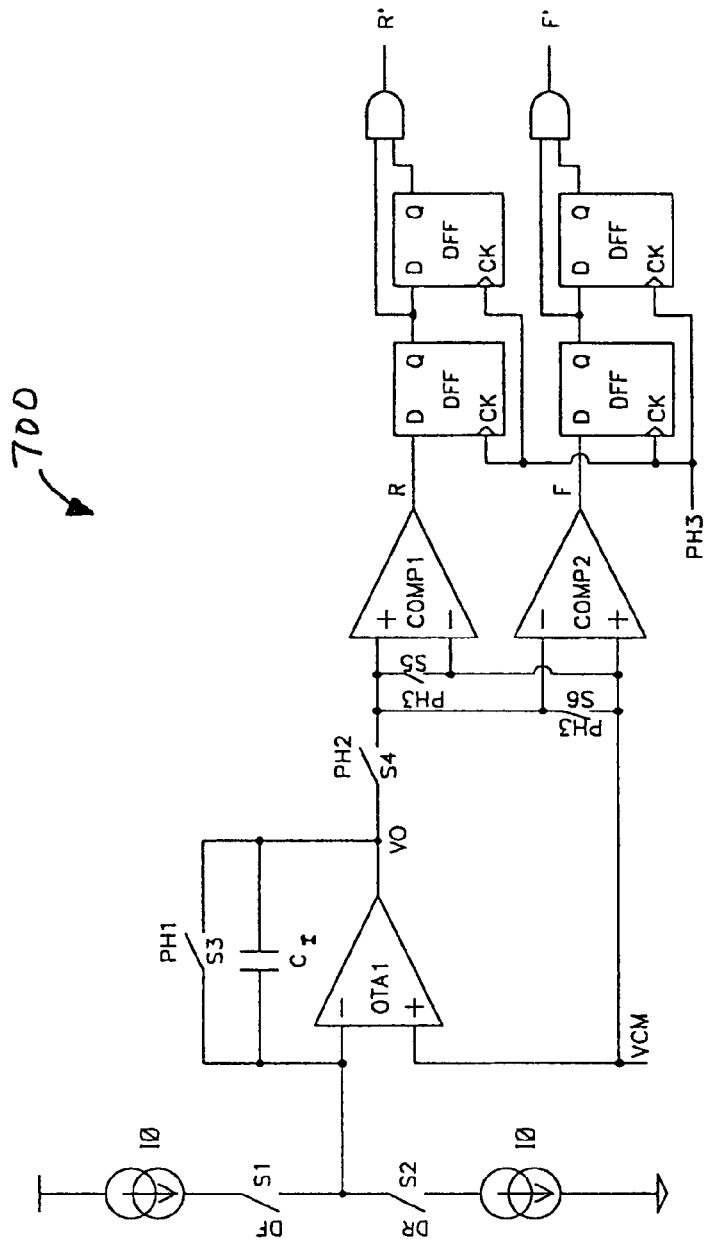
FIG. 7 is a schematic of a BBM distortion pattern detection circuit designed according to a specific embodiment of the present invention.
Figure 8:
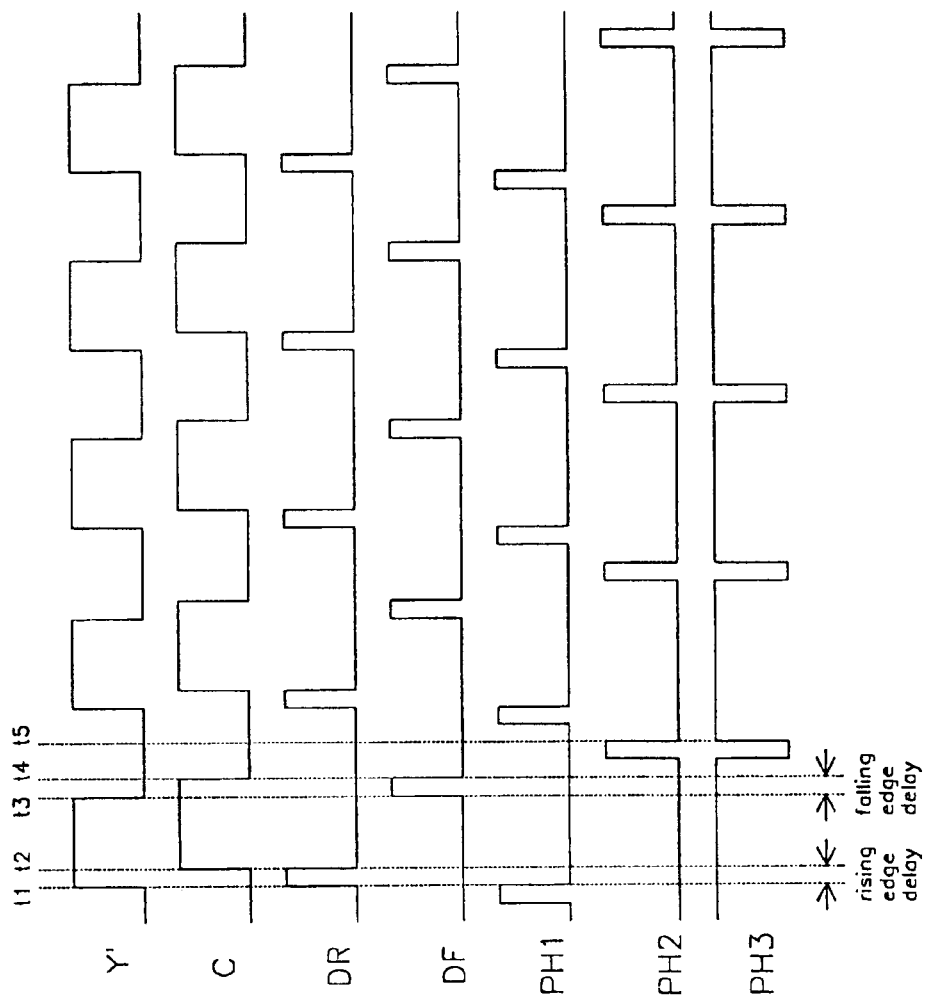
FIG. 8 is a timing diagram illustrating various waveforms controlling operation of the BBM distortion pattern detection circuit of FIG. 7.

Referring now to FIGS. 7 and 8, a distortion pattern detection circuit 700 is shown which detects the difference between the delays associated with the rising and falling edges of the signal at node C relative to the signal at node Y'. Circuit 700 employs a charge pump technique in which a constant current source $I_0$ of 10 uA is configured by switches S1 and S2 to either charge or discharge an integrator capacitor $C_I$ (2 pF). S2 and S1 are controlled by the rising edge delay (DR) and the falling edge delay (DF), respectively, which are shown in the timing diagram of FIG. 8. The integrator comprises operational amplifier OTA1 and capacitor $C_I$. A switch S3 (controlled by signal PH1) is connected in parallel with capacitor $C_I$ and is used to reset the output voltage of the integrator VO to the common mode voltage VCM.

To measure the delay difference, the integrator output is first set to VCM and switch S2 is closed during the rising edge delay time. This discharges capacitor $C_I$ and changes the integrator output voltage to:

$$VO(T_{DR}) = VCM + \frac{I_0 \times T_{DR}}{C_I}$$

During the falling edge delay time, S1 is closed, further changing the integrator output voltage to:

$$VO(T_{DR} - T_{DF}) = VCM + \frac{I_0 \times (T_{DR} - T_{DF})}{C_I}$$

Assuming a minimum BBM period of 40 ns (see Table I above), with $I_0$=10 uA and $C_I$=2 pF, the change in the output voltage of the integrator from its initial value VCM is given by:

$$\Delta V = VO(T_{DR} - T_{DF}) - VCM =$$

$$\frac{I_0 \times (T_{DR} - T_{DF})}{C_I} = \pm \frac{10\,\mu A \times 40\,ns}{2\,pF} = \pm 200\,mV$$

When the rising edge delay is smaller than the falling edge delay by the BBM period (e.g., FIG. 4b), the integrator output voltage will be at least 200 mV above VCM. By contrast, when the rising edge delay is longer than the falling edge delay by the BBM period (e.g., FIG. 4c), the integrator output voltage will be at least 200 mV below VCM. Thus, the delay difference can be determined by detecting $\Delta V$.

Referring again to FIG. 7, to detect $\Delta V$ and determine the BBM distortion pattern, two comparators COMP1 and COMP2 are employed. According to a specific embodiment, each of these comparators is designed with a 100 mV input DC offset to overcome the effects of circuit delay mismatch between the rising edge and the falling edge, and the intrinsic comparator offset voltage. That is, in the case where there is no pulse width change except due to the different circuit delays between the rising and falling edges, the outputs of the two comparators are not affected by the mismatch or the intrinsic offset voltage. In fact, with this design, circuit delay mismatches as large as 50 ns and intrinsic offset voltages as large as 50 mV can be tolerated.

After the falling edge delay time, switch S4 is closed (PH2 goes high) and switches S5 and S6 are opened (PH3 goes low). In this configuration, the integrator output voltage VO is compared to VCM to get the one of the results for outputs R and F shown in Table II.

TABLE II

| R | F | $\Delta V$ range |
|---|---|---|
| 0 | 0 | $-100\,mV < \Delta V < 100\,mV$ |
| 1 | 0 | $\Delta V > 100\,mV$ |
| 0 | 1 | $\Delta V < -100\,mV$ |

At the rising edge of PH3(t5) the comparison results R and F are latched into flip-flops DFF1 and DFF3 while the original data in DFF1 and DFF3 are shifted to DFF2 and DFF4, respectively. If two consecutive comparison results R and F are the same, then R' and F' are used to control BBM distortion compensation circuitry 504 in the following manner. When R'=F'=0, the pulse at node Y is delayed by a BBM period by compensation circuitry 504 to generate Y' as shown in FIG. 6c. When R'=1 and F'=0, the pulse at node Y is widened by a BBM period at the falling edge by compensation circuitry 504 to generate Y' as shown in FIG. 6a. When R'=0 and F'=1, the pulse at node Y is narrowed by a BBM period at the rising edge by compensation circuitry 504 as shown in FIG. 6b.

While the invention has been particularly shown and described with reference to specific embodiments thereof, it will be understood by those skilled in the art that changes in the form and details of the disclosed embodiments may be made without departing from the spirit or scope of the invention. Therefore, the scope of the invention should be determined with reference to the appended claims.

What is claimed is:

1. A switching amplifier, comprising:
   an input stage for generating a switching signal;
   break-before-make distortion compensation circuitry for altering a pulse width associated with the switching signal;
   break-before-make generator circuitry for generating two drive signals from the altered switching signal;
   a power stage including two switches which are alternately driven by the two drive signals and an output node, and
   break-before-make distortion detection circuitry for detecting a distortion pattern at the power stage output node;
   wherein the break-before-make distortion detection circuitry controls the break-before-make distortion compensation circuitry to alter the switching signal in response to the distortion pattern detected to thereby eliminate at least some break-before-make distortion.

2. The switching amplifier of claim 1 wherein the input stage, the break-before-make distortion compensation circuitry, the break-before-make generator circuitry, and the power stage are configured in a feedback loop in which continuous-time feedback is provided from the output node of the power stage to the input stage.

3. The switching amplifier of claim 2 wherein the input stage comprises a loop filter and a comparator.

4. The switching amplifier of claim 1 wherein the break-before-make distortion corresponds to a plurality of distortion patterns, the break-before-make distortion detection circuitry being configured to detect which of the plurality of patterns currently corresponds to the break-before-make distortion.

5. The switching amplifier of claim 4 wherein the break-before-make distortion detection circuitry comprises first circuitry for generating a first voltage representative of a relationship between first and second delay times for a rising edge and a falling edge, respectively, of a signal at the output node of the power stage, and second circuitry for comparing the first voltage to a reference voltage to determine which of the plurality of patterns currently corresponds to the break-before-make distortion.

6. The switching amplifier of claim 5 wherein the first circuitry comprises an integrator which is charged for the first delay time and discharged for the second delay time, and wherein the second circuitry comprises comparator circuitry for determining whether either of the first and second delays is longer than the other by more than a threshold amount.

7. The switching amplifier of claim 6 wherein the second circuitry further comprises storage elements for storing output data from the comparator circuitry for at least one pair of first and second delay times.

8. A method for reducing break-before-make distortion in a switching amplifier, the switching amplifier comprising break-before-make generator circuity for generating two drive signals from an altered switching signal, and a power stage including two switches which are alternately driven by the two drive signals and an output node, the method comprising:
   detecting a distortion pattern at the output node of the power stage; and
   altering a pulse width associated with a switching signal before the break-before-make generator circuity in response to the distortion pattern detected thereby eliminating at least a portion of the break-before-make distortion.

9. The method of claim 8 wherein detecting the distortion pattern comprises determining first and second delay times for a rising edge and a falling edge, respectively, of a signal at the output node of the power stage and determining whether either of the first and second delays is longer than the other by more than a threshold amount.

10. The method of claim 8 wherein a break-before-make period is associated with the break-before-make generator circuitry and the distortion pattern corresponds to an output signal at the output node of the power stage having a first pulse width associated therewith which is greater than a second pulse width associated with the switching signal by the break-before-make period.

11. The method of claim 10 wherein altering the switching signal comprises reducing the second pulse width by the BBM period at each rising edge of the switching signal.

12. The method of claim 8 wherein a break-before-make period is associated with the break-before-make generator circuitry and the distortion pattern corresponds to an output signal at the output node of the power stage having a first pulse width associated therewith which is less than a second pulse width associated with the switching signal by the break-before-make period.

13. The method of claim 12 wherein altering the switching signal comprises increasing the second pulse width by the BBM period at each falling edge of the switching signal.

\* \* \* \* \*